US006465792B1

(12) United States Patent
Baptist

(10) Patent No.: US 6,465,792 B1
(45) Date of Patent: Oct. 15, 2002

(54) MINIATURE DEVICE FOR GENERATING A MULTI-POLAR FIELD, IN PARTICULAR FOR FILTERING OR DEVIATING OR FOCUSING CHARGED PARTICLES

(75) Inventor: Robert Baptist, Jarrie (FR)

(73) Assignee: Commissariat a l'Energie Antomique, Paris (FR)

( * ) Notice: Subject to any disclaimer, the term of this patent is extended or adjusted under 35 U.S.C. 154(b) by 0 days.

(21) Appl. No.: 09/381,917

(22) PCT Filed: Apr. 27, 1998

(86) PCT No.: PCT/FR98/00831

§ 371 (c)(1), (2), (4) Date: Sep. 27, 1999

(87) PCT Pub. No.: WO98/49711

PCT Pub. Date: Nov. 5, 1998

(30) Foreign Application Priority Data

Apr. 25, 1997 (FR) ........................................... 97 05153

(51) Int. Cl.[7] .......................... H01J 49/00; H01J 37/12; B01D 59/44

(52) U.S. Cl. .................................. 250/396 R; 250/292

(58) Field of Search ............................ 250/292, 396 R

(56) References Cited

U.S. PATENT DOCUMENTS

| | | | | | |
|---|---|---|---|---|---|
| 3,648,046 | A | * | 3/1972 | Denison | 250/292 |
| 3,935,452 | A | * | 1/1976 | Prince | 250/292 |
| 4,704,532 | A | * | 11/1987 | Hua | 250/292 |
| 5,315,120 | A | * | 5/1994 | Potter | 250/292 |
| 5,596,193 | A | * | 1/1997 | Chutjian et al. | 250/292 |

FOREIGN PATENT DOCUMENTS

| | | |
|---|---|---|
| WO | WO 96/31901 | * 10/1996 |

* cited by examiner

*Primary Examiner*—Bruce Anderson
(74) *Attorney, Agent, or Firm*—Thelen, Reid & Priest LLP; Robert E. Krebs

(57) ABSTRACT

The invention relates to a micro-device for generating a multi-polar transverse field, or a micro-device for the filtration or the deflection or the focusing of charged particles, comprising n longitudinal conductive micro-beams (32, 34, 36, 38), of polygonal cross section, and arranged around a longitudinal axis (AA').

15 Claims, 6 Drawing Sheets

FIG.7B
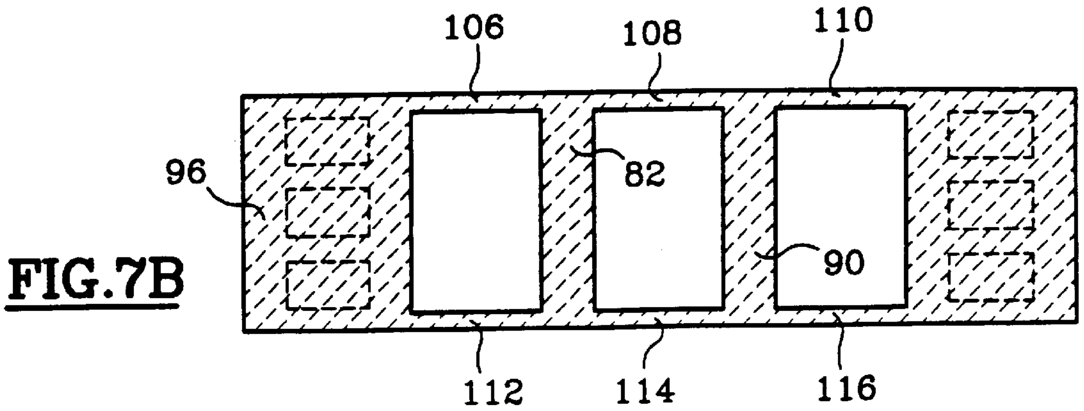
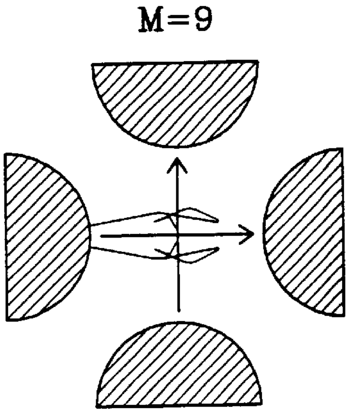
FIG.8A
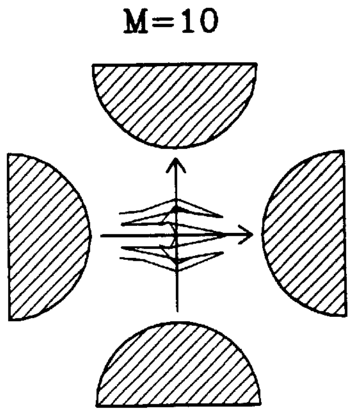
FIG.8B
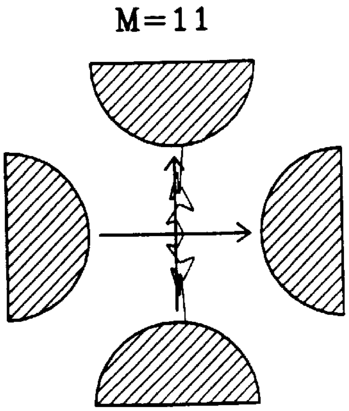
FIG.8C

MINIATURE DEVICE FOR GENERATING A MULTI-POLAR FIELD, IN PARTICULAR FOR FILTERING OR DEVIATING OR FOCUSING CHARGED PARTICLES

TECHNOLOGICAL FIELD AND PRIOR ART

The invention relates to the field of electrode architectures that permit the generation of a multi-polar field, or permit the filtration or the deflection or the focusing of charged particles. More particularly, the invention relates to micro-devices that integrate assemblies of micro-electrodes, also for the purpose of generating a multi-polar field in particular for the filtration or deflection or focusing of charged particles.

The invention finds application notably in the field of mass spectrometry: in effect, the assemblies of electrodes according to the invention can be used in mass spectrometers. The invention therefore also relates to the field of mass spectrometry.

Mass spectrometry is an analysis technique widely used in laboratories and in industry. Using mass spectrometry the nature of constituents of a gas can be determined with a sensitivity better than ppm. To do this, the gas to be analyzed must be at low pressure, in general less than $10^{-4}$ mbar. This is a limitation for applications where the pressure is greater ($10^{-2}$ mbar) and for which it is then necessary to add pumps and supplementary circuits so as to reduce the pressure in the area where the mass spectrometer is. The creation of a spectrometer of small size ($\approx 1$ cm$^3$) would allow one to work under a lower level of vacuum.

In a general way, a mass spectrometer comprises three distinct parts, as illustrated in FIG. 1: an ionization chamber 2, a separator 4 (filter) and an ion detector 6. Many separators are of the quadrupolar type. The theory of uni-polar and quadrupolar mass spectrometers etc is for example described in the book "Techniques de l'Ingénieur", volume P3, P 2615, p. 1–39. The mass filter 4 is the place where, through the set of electromagnetic forces, the ions of different masses are separated. In a quadrupole (an accepted term meaning "a mass analyzer fitted with a quadrupolar type filter"), a high frequency electric field is generated between 4 parallel bars 8, 10, 12, 14 such as those shown in FIG. 1. It is assumed that the ions move along the mean direction OZ parallel to the bars.

In a general way, a quadrupolar electric field is such that its amplitude is a linear function of the co-ordinates. The electrical potential is therefore a quadratic form of the co-ordinates. It can be written in the form $V=(\phi/r^2)\times(x^2-y^2)$ where r is the distance between the axis OZ and the bars (r is also called the throat radius of the quadrupole) and $\phi$ a constant value of the potential. In order to obtain such a potential distribution, two opposite bars are polarized to +V, while the two others are polarized to −V.

In the case of a quadrupole being used as a filter or a means of focusing or of deflection, the potential V in addition comprises a time dependent component (term in cos $\omega t$) which is used to make the charged particles oscillate. The lines of equipotential, which, at a given moment, correspond to this distribution of potentials (as a function of the potentials applied to the bars) are hyperbolae in the plane XOY. In the ideal case, the cross sections of the bars have this same hyperbolic form. A quadrupolar system with bars 16, 18, 20, 22 of hyperbolic section is illustrated in FIG. 2 and is, for example, described in U.S. Pat. No. 5,373,157.

In the majority of cases, and in order only to use machining that is easy to carry out, the bars have circular cross sections osculating to hyperbolae at their peak; such cross sections 26, 28, 30, 32 are also shown in FIG. 2. A degradation of resolution results from passing from the hyperbola to the circle.

If one wishes to reduce the size of a quadrupolar spectrometer to about 1 cm$^3$, all the dimensions of the filter are affected by this, in particular the radius of the bars, their distance to the center and, of course, their length.

Document WO-96/31901 describes a miniaturized quadrupolar mass spectrometer. This device uses cylindrical beams made from metal coated optical fibers. In such a device, the insulators situated between the cylindrical bars can lead to charge effects which are prejudicial to the operation of the device.

The patent U.S. Pat. No. 5,401,962 describes a miniature quadrupole. In this document, the miniaturization or the reduction in size, originates from the assembly of a plurality of quadrupoles in parallel. This device lacks resolution. Furthermore, its production, even when it uses cylindrical electrodes is rather time consuming.

Document U.S. Pat. No. 4,994,336 describes a control plate for a lithography device. This control plate essentially comprises a semi-conductor substrate in which a window or opening is made to allow the passage of beams of particles. Deflection elements allow the beams to be deflected.

This document also describes methods of producing such a plate. In these methods, the deflection elements are obtained by etching a layer to produce depressions in it that have the shape of deflection elements. The deflection elements are then created along a direction perpendicular to the plane of these layers.

Finally, in this document, the field generated is a uniform field in all directions and in all the space between the flat electrodes. This field is not multi-polar.

DESCRIPTION OF THE INVENTION

The problem posed therefore is that of producing components, notably for their application to mass spectrometry, that allow among other things the miniaturization of the spectrometers.

In particular, the problem is posed of creating assemblies of electrodes which would enable easy production of micro mass spectrometers.

More precisely, a subject of the invention is a micro-device for generating a multi-polar transverse field, comprising n conductive longitudinal micro-beams of polygonal cross section, arranged around a longitudinal axis.

Advantageously, the field is constant along the longitudinal axis.

By a multi-polar field one understands any electrical field, even a mono-polar one. Such a field is not uniform since it is multi-polar or mono-polar.

Consequently, according to the invention, the creation of electric fields on a sub-millimeter scale, and which are derived from potentials which are for example, of the quadrupolar, hexapolar or octopolar type or more generally are N-polar (N>1) can be carried out with electrode structures (also called lenses) in which the electrodes have a cross section of polygonal shape. Such electrodes are compatible with production using micro-electronic or micro-technology techniques and therefore permit the manufacture of miniaturized mass spectrometers.

Another subject of the invention is a micro-device for the filtration or the deflection or the focusing of charged particles, comprising n conductive longitudinal micro-beams, with polygonal cross section, and arranged around a longitudinal axis of propagation of the charged particles.

Another subject of the invention is a micro-device for the filtration, or the deflection or the focusing of charged particles that comprises a micro-device to generate a multi-polar transverse field such as that already described above.

For this, the invention specifies an electrode structure for a micro-device for filtration, or deflection or focusing, which is compatible with production by the techniques of micro-electronics or micro-technology. Electric fields can also be generated for a micro-device for filtration, or deflection or focusing on a sub-millimeter scale.

At present, the electrodes used in a quadrupolar type device, or more generally an N-polar device, have sizes which cannot be reduced below certain dimensions, which limits the lower size of the device. In particular, document U.S. Pat. No. 5,401,962 mentions cylindrical electrodes of a diameter between 0.5 mm and 1 mm, and of a length between about 1 cm and 2 cm. The electrode structure according to the invention allows sub-millimeter devices to be produced (for example with bars whose thickness is a few hundreds of $\mu$m) which are able to work at higher pressure (for example about $10^{-2}$ mbar).

The assembly in parallel of several multi-polar structures according to the invention allows the intensity of the output signal from this same structure to be increased. The production of such a structure proceeds through the production of certain parts of the structure in an individual way, and then through a step of assembling these parts, in parallel.

Means of polarizing the conductive micro-beams can be connected to the multi-polar structures according to the invention. Similarly, means can be linked to them of introducing ions or charged particles along a direction defined by the longitudinal axis or axes. A multi-polar field is linked to each longitudinal axis, all the longitudinal axes being parallel.

According to one particular embodiment, each micro-beam can be produced in a flat substrate and held in the plane of the substrate by support bars.

The micro-device can comprise:

- at least first and second sheets made of insulating or semiconductor material
- means that allow the sheets to be held parallel at a certain distance from one another,
- areas etched into each sheet to define micro-beams in them.

The micro-device comprises for example

- first, second and third sheets made of insulating or semiconductor material,
- means that allow the first and second sheets to be held parallel at a certain distance from one another,
- means that allow the second and third sheets to be held parallel at a certain distance from one another,
- areas etched into each sheet defining micro-beams in them.

The means of holding the sheets parallel to one another may, in addition, permit alignment of said sheets in a way that provides the desired multi-polar field. For example, these means are cross members arranged in slots created in the sheets to ensure this alignment.

These structures are totally compatible with collective and extremely precise production (to about ±1 $\mu$m), which can be implemented using etching techniques and working techniques known in the field of micro-electronics.

Another subject of the invention is a mass spectrometer comprising a micro-device according to the invention, such as that described above, means of introducing ions and means of detection.

Finally, a subject of the invention is a method of producing a micro-device for generating a multi-polar transverse field and in particular a micro-device for the filtration, or the deflection or the focusing of charged particles, comprising the following steps:

- etching P substrates made of insulating or semiconductor material in such a manner as to define, in each substrate one or more micro-beams,
- coating the micro-beams with metal
- assembling P etched substrates in parallel with one another.

BRIEF DESCRIPTION OF THE FIGURES

The characteristics and advantages of the invention will better become apparent in the light of the description which follows. This description focuses on embodiment examples given for purposes of explanation which are not limitative and which make reference to the appended drawings in which:

FIGS. 7A and 7B represent in section and in a view from above, a multiple quadrupole according to the invention machined by micro-technology, FIGS. 8A to 8C represent results of filtration simulation around mass M=10, using a spectrometer with cylindrical bars.

DETAILED DESCRIPTION OF EMBODIMENTS OF THE INVENTION

Figure 1:
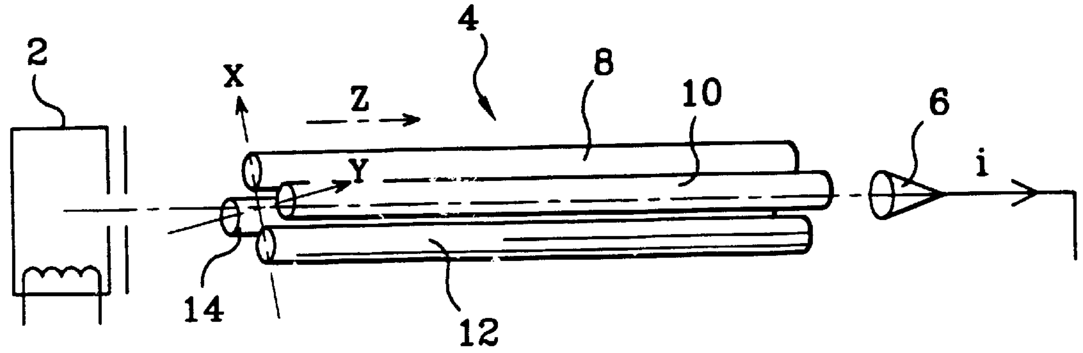
FIG. 1 diagrammatically represents a quadrupolar type mass analyzer.
Figure 2:
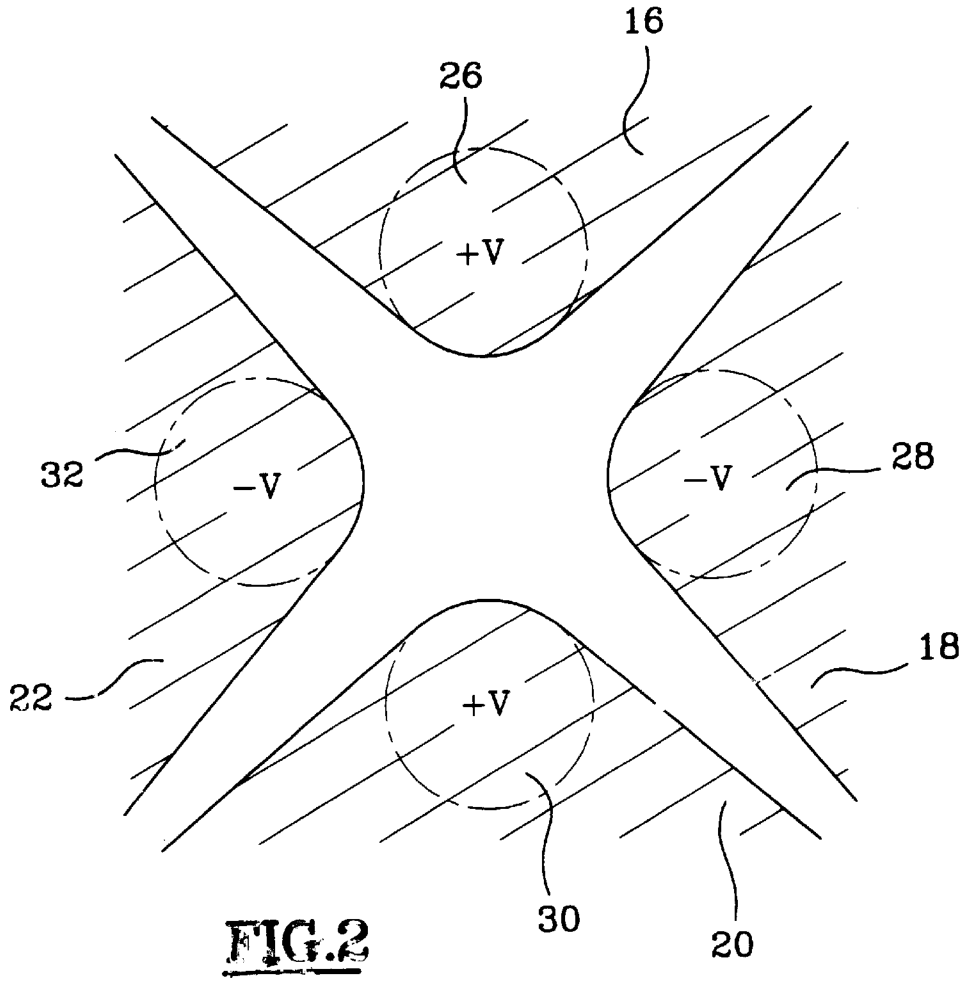
FIG. 2 illustrates the creation of quadrupoles using hyperbolic or cylindrical electrodes.
Figure 3:
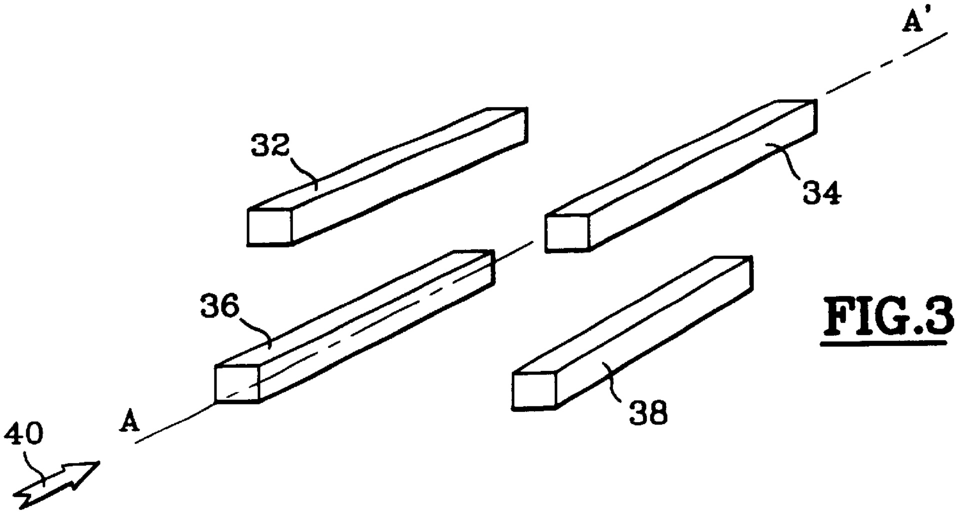
FIG. 3 represents the embodiment of a quadrupole according to the invention.

A structure for the creation of a quadrupole according to the invention is illustrated in FIG. 3. In accordance with this structure, electrodes 32, 34, 36, 38, of polygonal cross section, are arranged parallel to one another and in a symmetrical manner with respect to an axis AA'. The polygonal section shown in FIG. 3 is a square section, but other polygonal sections (pentagonal, hexagonal, etc.) can be created within the scope of the invention. In the case of a square cross section, the side of the square e may, for example be equal to 0.5 mm (or less) and the electrode, for example, has a length of the order of 10 mm.

Below, examples are given for which the bars have thicknesses of about 300 $\mu$m or 500 $\mu$m.

This electrode assembly constitutes a quadrupolar structure that can be used for example in the context of a mass spectrometer. Such a quadrupolar structure is then coupled on the one hand to a source of ions (situated at one end of the quadrupolar structure) and on the other hand to an ion detection system (situated at the other end of the quadrupolar structure). Examples of such sources of ions and such detection systems are described in the book "Techniques de l'Ingénieur", volume P3, P 2615, p. 1–39.

Each of the electrodes is connected to means of applying a certain potential to it. The result is an electric field in the space between the four electrodes, and around the axis AA'. If the generated electric field is a quadrupolar electric field, its amplitude will be a linear function of the X, Y and Z co-ordinates.

When the quadrupole is used as a filter or a means of deflection or of focusing the beam of particles 40, the potential V additionally includes a time dependent component (a cos ωt term) which allows the charged particles to be oscillated.

Figure 4A:
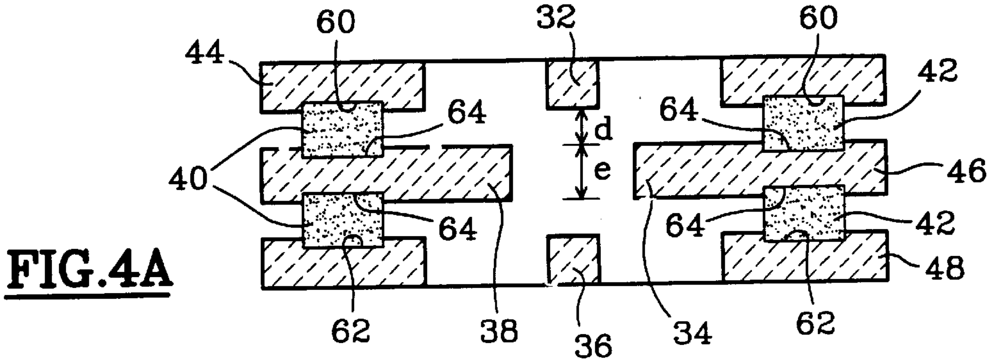
FIGS. 4A and 4B represent, in section and in a view from above, a detailed embodiment of a quadrupolar system according to the invention, FIG. 5 diagrammatically represents a ladder of micro-beams.
Figure 4B:
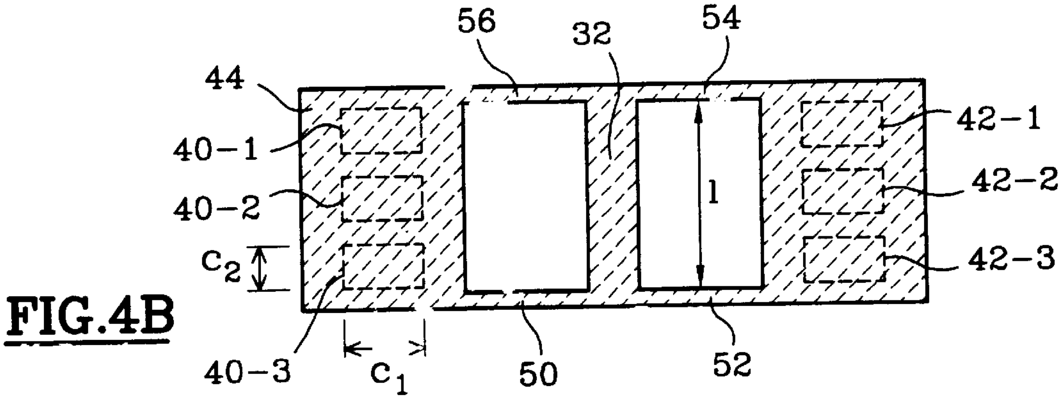

An embodiment of a quadrupolar system according to the invention is illustrated in a more precise way in FIG. 4A. In this Figure, reference numbers identical to those in FIG. 3 designate the micro-beams, of polygonal section (in this case square), of the quadrupolar device. The device also comprises cross members 40, 42, that permit separation of the upper plane 44, in which the upper micro-beam 32 is produced, from the intermediate plane 46, in which the two micro-beams 34, 38 are produced, and, on the other hand, the intermediate plane 46 from the lower plane 48 in which the micro-beam 36 is produced. FIG. 4B represents a view from above of this device: the upper micro-beam 32 is obtained, for example, by etching and partial or total metal coating of a wafer of insulating or semiconductor material that defines the plane 44. The length l of the windows created by etching in the plane 44 is about 20*e* (where e is the thickness of a micro-beam).

Similarly, the micro-beams 34, 38 are obtained by etching and partial or total metal coating of a wafer of insulating or semiconductor material that defines the plane 46 and the lower micro-beam is obtained by etching and partial or total metal coating of a wafer of insulating or semiconductor material that defines the lower plane 48. The thickness e of the bars is then determined by the thickness of the wafers of insulating or semiconductor material which have been etched. For example, one can have bars or micro-electrodes of thickness 300 $\mu$m or 500 $\mu$m. For a thickness of 500 $\mu$m, the upper bar or micro-electrode 32 is positioned at a distance d approximately equal to 0.74e=0.74×500=370 $\mu$m from the bars 34, 38.

In FIG. 4B, reference numbers 50, 52, 54, 56 designate support bars which link the micro-beam 32 to the rest of the plane 44. In each of the other planes, 46, 48, such support bars support the micro-beams and link them to one another or to the etched substrate.

Slots 60, 62, 64 are also created in the various wafers of material so as to be able to position the cross members 40, 42.

If these slots are created by etching the wafers of material, they would have a thickness equal to the distance separating two parallel planes increased by the depth of etching in each of the sheets of material. Returning to the example above, and assuming that the slots 60, 62, 64 are etched over a depth of 10 $\mu$m, the cross members 40, 42 would have a total height of: 370+10+10=390 $\mu$m.

The cross members can be produced, depending on the length of the device, in a single block or in several blocks. For example, in FIG. 4B, reference numbers 40-1, 40-2, 40-3 and 42-1, 42-2, 42-3 designate the locations of six cross members (three aligned cross members for each side) which separate the upper 44 and intermediate 46 planes. In a view from above, each cross member has small dimensions $c_1$, $c_2$, each for example equal to or less than 1 mm. There can be several cross members on each side; however, preferably, each cross member is of a small size, so that the ions which are away from the central longitudinal axis of the apparatus, along which they are being propagated, will not be deposited on them, which would lead to undesirable charge effects.

A method of producing such a structure will now be described. Firstly, one selects wafers in which the upper 44, intermediate 46 and lower 48 planes of the structure will be created. Such wafers can be silicon wafers, of thickness e ranging for example from 0.5 mm. One then proceeds to the following steps 1 to 4.

1)—The upper 44 and lower 48 sheets are etched (deep etching) in order to make apparent on the one hand, the central bars 32, 36 and on the other hand, the slots 60, 62 which will be used for positioning and the fixing of the assembly. Known techniques employing masks and lithography are used before etching. The deep etching operation occurs in two stages so as to be able to keep four support bars 50, 52, 54, 56, preferably as fine and small as possible, their role being to support the central bar 32, 36. First of all, each sheet is etched on one side to the extent that the thickness of the support bar is preserved and then on the other side in order to unblock it at the same time preserving the support bar (thanks to a second lithography step).

2)—The intermediate sheet (possibly in two pieces), of the same thickness as the preceding sheets, is etched so as to define the right 34 and left 38 bars and the slots 64 for the cross members.

3)—Partial or total metal coating of the bars allow one to apply various voltages from connection electrodes to the four bars.

4)—Cross members 40, 42 made of insulating material ($SiO_2$) are etched so that, on the one hand, they can be housed in the slots 60, 62, 64 created on the three preceding sheets and, on the other hand, they have the thickness required to separate the three sheets (in this case, the space between the sheets is, for example, 0.74e). For application to mass spectrometry, the following steps can be added 5)—A mini ionization chamber and a detector of the Faraday cage type or an electron multiplier are added to the filter assembled in this way. Inlet and outlet orifices for the ions will be aligned along the axis of each quadrupole. Possibly, electrodes which are used as an electrostatic shield or a focusing lens to bring the ion beam to the inlet to the filter are added to the system. With respect to the ionization, this occurs by known methods (ionization by electron beams coming from a filament or micro-tip or micro-edge cathode, or arising from a discharge). Detection takes place using traditional devices.

The method described above makes use of techniques that come from the fields of micro-technology and micro-electronics and permits the creation of square or polygonal section bars with great precision. Such techniques are compatible with collective manufacture that allows one to specify precise dimensions for the whole of the architecture (an accuracy of the order of a micrometer can be achieved) the more so when a part of the assembly can be carried out at the time the bars are manufactured. The techniques of deep etching of silicon wafers known within the field of micro-technology or micro-electronics allow one to obtain rectangular sections starting with wafers with parallel surfaces. Similarly, the anisotropy of etchings dependent on crystalline surfaces allows one to obtain polygonal profiles.

Besides coupling them to a source of ions and/or an ion detection system and going beyond the assembly in FIG. 4A, the electrodes can be mounted at their ends, onto two support plates parallel to one another, each plate having slits or inlets or outlets required for the path of the ions. This device can be produced, in micro-technology, by a method known by the name of “LIGA”

The structure described above is a quadrupolar structure, for example for providing a quadrupolar electric field. This structure can be generalized to the production of an assembly of n conductive micro-beams, of polygonal cross section, that allow one to obtain a multi-polar transverse field (and, advantageously a longitudinally uniform field).

The invention also relates to the creation of a multiple structure, for example of an assembly of quadrupoles operating in parallel. The reduction, by a factor k, of the dimensions of a quadrupole, leads to the reduction, by a factor $k^2$, of the inlet slit. So as to preserve enough signal without increasing the size of the slits (which would lead to deterioration in the resolution at high mass), one compensates for this attenuation by placing a $k^2$ quadrupole in parallel. The gain in volume is therefore a factor k, and the sensitivity remains the same.

For example, if all the dimensions are reduced by 2, the quadrupole is reduced, in weight and in volume, by a factor $2^3=8$. The inlet slit is reduced by a factor $2^2=4$. By placing four quadrupoles in parallel, each with new reduced slits, the same surface area of slit inlet is obtained and a total volume is equal to $4\times(1/8)=0.5$ times the volume of the original quadrupole before reduction. Hence one gains by a factor of 2 as a minimum and even more, since one or more bars are common for several quadrupoles in parallel. So as to maintain or to increase the intensity of the total signal received by the detector, one can therefore create a structure of quadrupoles (or n-poles) mounted in parallel.

Figure 5:
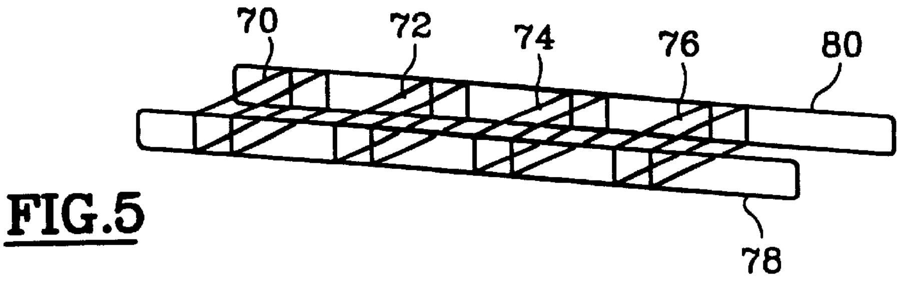

Hence, one can create “ladders” of bars, of square or polygonal cross section, that one can then assembly parallel to one another using micro-technology techniques. Such a ladder is illustrated in FIG. 5, where reference numbers 70, 72, 74, 76 designate individual poles, connected in a fixed manner to one another by support structures 78, 80 at each of their ends.

Figure 6:
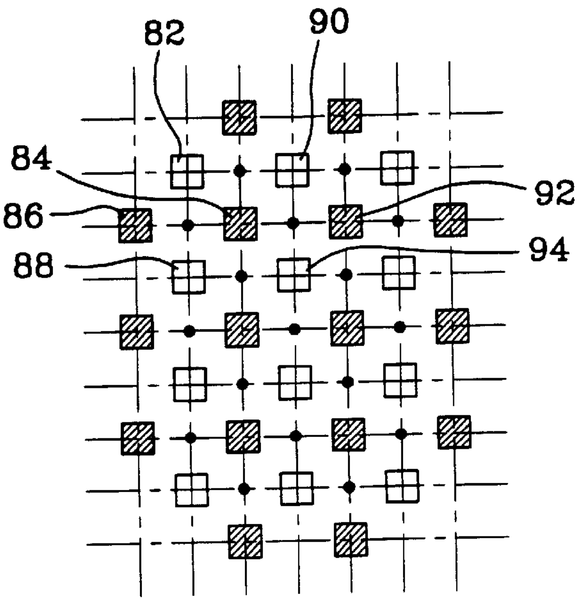
FIG. 6 is a plan view of a quadrupole assembly operating in parallel.

FIG. 6 is a view, from the side of the ion inlet face, of an assembly of quadrupoles operating in parallel. Each of the ladders corresponds to a line of black or white squares. Each individual quadrupole (for example that defined in FIG. 6 by the bars 82, 84, 86, 88) has a micro-beam in common with the quadrupole next to it on the same line (in FIG. 6 this is the quadrupole defined by the micro-beams 90, 92, 94, 84).

So as not to obstruct the ion inlet, one can choose to make ladders in which one out of two micro-beams is positively polarized (for example the black bars in FIG. 6), the others being negatively polarized. One can also choose to make the ladders with all the bars having the same polarization (all blacks or all whites): in this case, a slit will be made on each side, in order to define an inlet slit and an outlet slit for the ions.

The creation of a multi-lens (or a multiple structure of the type described above in connection with FIG. 6) calls upon the same type of micro-technology as that explained above for the creation of a single lens or a single quadrupole.

Figure 7A:
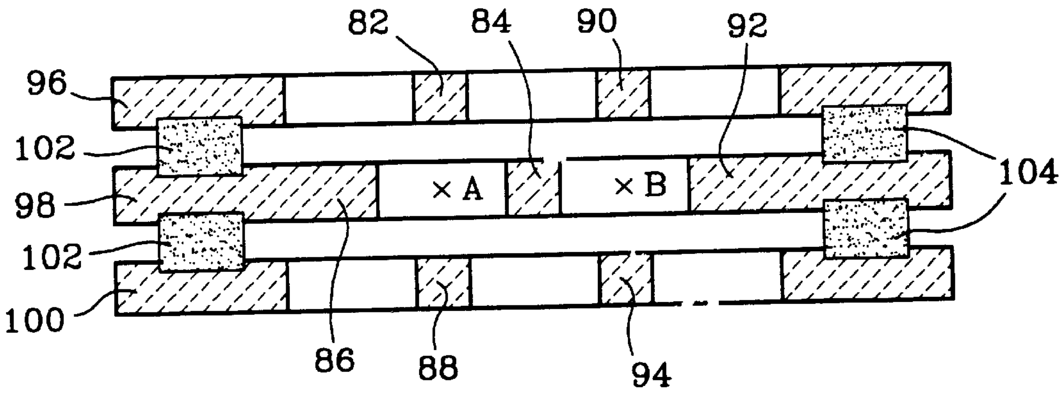

FIG. 7A illustrates the production of two quadrupoles arranged side by side, the micro-beams being designated by reference numbers 82–94.

As in the case of the structure illustrated in FIG. 4A, the micro-beams are produced in flat etched substrates 96, 98, 100, the assembly of which is carried out with the help of cross members 102, 104 for separation.

FIG. 7B represents a view from above of the structure of FIG. 7A. Each micro-beam 82, 90 is supported by support bars 106, 108, 110, 112, 114, 116 created by etching the wafer 96.

Similarly, in the plane of the intermediate wafer 98, the micro-beam 84 is supported by similar bars. Preferably, these bars are made as fine and as small as possible, so that they are not an obstacle to the ions incident to or emerging from the quadrupoles, or the multipoles.

For example, the bars have lengths of 1240 $\mu$m (0.74e+e+0.74e) for a section of 10 $\mu$m×10 $\mu$m (the dimensions are given to ±1 $\mu$m).

The inlet and outlet orifices for the ions are aligned on the axis of each quadrupole: the points A and B in FIG. 7B are the paths of these axes in this Figure.

A comparative simulation of a traditional quadrupole (with an electrode of circular section) and a quadrupole with a square bar (conforming to the invention) has been carried out.

The study of the movement of an ion (confined to the central region, close to the axis of the quadrupole), under a potential dependent on variables x, y, z and time, for a given quadrupolar configuration is possible in an analytical manner or by simulation. The potentials +V and −V are variable in time so that the ion is successively attracted by one group of electrodes and then attracted by the two other electrodes, this being in a cyclical manner.

A)—Case of the traditional quadrupole: bars of circular section of radius $r_0=0.39$ mm, with a throat radius of 0.45 mm were considered. The length of the bars is of the order of 10 mm; such a value can be considered to be large in relation to the transverse dimensions and allows a certain number of oscillations of the ion along its path. The polarization of the electrodes as a function of time is simulated using an electronic optical program (SIMION program, version 4.0, D. A. Dahl and J. E. Delmore, Idaho National Engineering Laboratory, 1988). The solution chosen to fix the voltages U and V (DC part and AC part of the potential applied to the bars) is that used by the majority of manufacturers (U/V ratio=0.17).

The FIGS. 8A–8C are an example of the results obtained, for a filtration around mass M=10 (M=9: FIG. 8A, M=10: FIG. 8B and M=11: FIG. 8C). In these Figures, only half of each bar is represented. From these Figures, it may be observed that for a kinetic energy of 10 eV in the direction of the quadrupole axis, the atomic mass 9 oscillates a certain number of times and then diverges after 3 mm of trajectory, the atomic mass 10 remains stable under oscillation (and hence passes through the filter) while atomic mass 11 diverges after 4 mm of unstable oscillating trajectory.

Figure 9A:
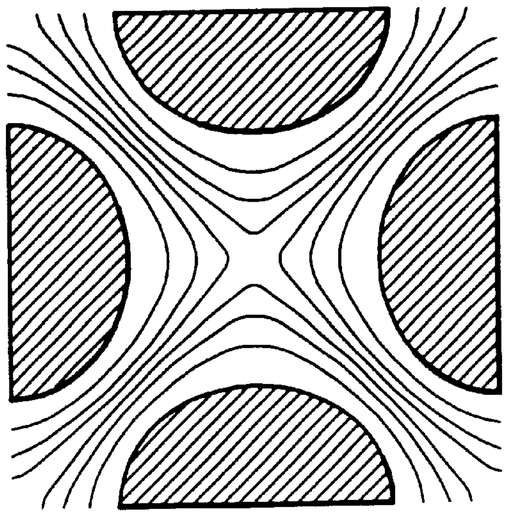
FIGS. 9A and 9B represent potentials obtained with cylindrical bars (FIG. 9A) or square section bars (FIG. 9B)
Figure 9B:
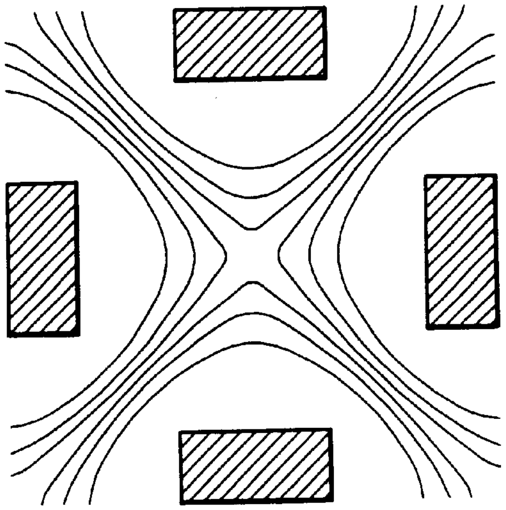

B)—Case of the quadrupole with square bars: in this case, we first sought to check that potential conditions in the central region (hyperbolic shapes), similar to those obtained with the bars of circular section, could be provided with bars of square or polygonal section. This is what was done and it was possible to show, by simulation, that the use of square bars of small section allows one to obtain the same map of electrical potential in the central region of the quadrupole as that obtained using bars of round section. FIGS. 9A and 9B shows the juxtaposition of the equipotentials of a model with bars of round section (cylinders of diameter 2×r (=0.78 mm), FIG. 9A) and another with square section bars (square beams with a side a=0.46 mm, FIG. 9B). The surfaces of the square beams being further from the axis of the quadrupole than those of the cylinders, a higher potential is applied to these electrodes. In the case studied, the potential is doubled to obtain the same map of potential at the center.

Figure 10A:
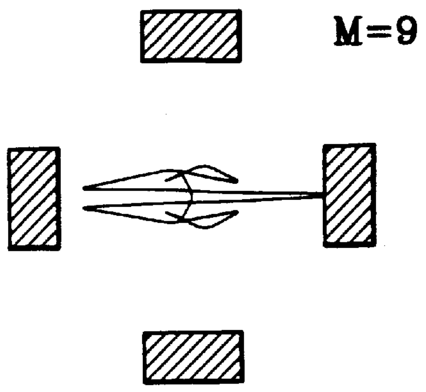
FIGS. 10A to 10C represent results of filtration simulation around mass M=10 using a spectrometer with bars of square section.
Figure 10B:
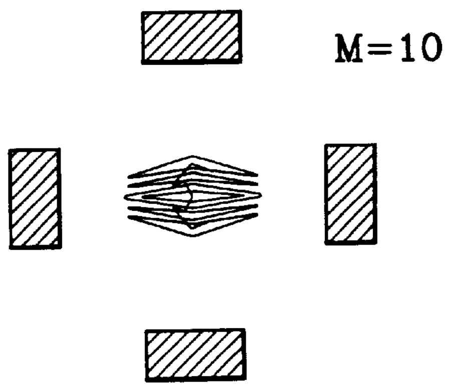
Figure 10C:
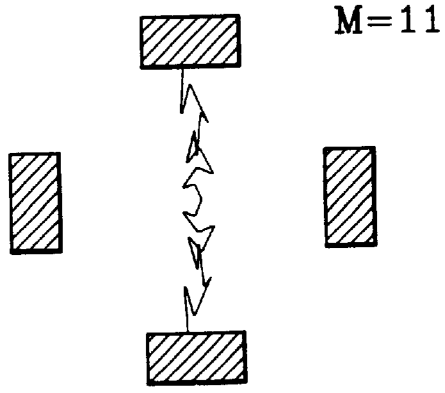

FIGS. 10A to 10C represent the filtration of mass 10 (in comparison with masses M=9 and M=11) in the case of a spectrometer with bars of square section. It may be observed that the filtration takes place just as well as with the cylindrical bars.

The micro-beam structure according to the invention allows the creation of electrodes with controlled geometry. This geometry allows one to provide results both as far as the electric field and the filtering capacity are concerned that are as good as those from cylindrical electrodes. Furthermore, the geometry proposed is compatible with production using techniques from micro-electronics, which allow collective manufacture: techniques of etching substrates or semiconductor wafers are in effect well controlled. Consequently, the electrode structure according to the invention allows a device to be produced that has good resolution as well as good performance reproducibility and the cost of which is low in comparison with devices that are currently known.

The devices according to the invention can be used in all fields of mass spectrometry, where knowledge of the nature of gases and pollutants is desired (for example in the environmental field or in the micro-electronics industry). Even at reduced resolution, for example at $\Delta M=\pm 3$, such an instrument (or sensor) can be of interest. In effect, for example, contamination by hydrocarbons is detectable between masses 50 and 60, without other masses which disrupt the analysis being in this range: a reduced resolution can then be tolerated.

What is claimed is:

1. A micro-device for the filtration or the focusing of charged particles comprising n conductive longitudinal microelectrodes, arranged around a longitudinal axis of propagation of the charged particles, characterized in that the n microelectrodes are made up of P monolithic blocks, each comprising one or more microelectrodes of polygonal cross section, P being a whole number greater than or equal to 2, the P blocks being assembled in parallel with one another in such a way that the microelectrodes are adapted to generate a non-uniform electric field in a plane perpendicular to the longitudinal axis.

2. A micro-device according to claim 1, characterized in that each block is created in a flat substrate and in that it comprises support bars to rigidly link the microelectrodes of the block.

3. A micro-device according to claim 2, characterized in that the flat substrate is a sheet of insulating or semiconductor materials in which etched areas define the microelectrodes and in that it comprises means for holding the sheets parallel at a certain distance from one another.

4. A micro-device according to claim 3, the means that permit the sheets to be held parallel in addition carrying out an alignment of these sheets in a way that provides a multi-polar field.

5. A micro-device according to claim 4 characterized in that the etched areas of the sheet also define the support bars.

6. A micro-device according to claim 3 characterized in that the etched areas of the sheet also define the support bars.

7. A micro-device according to claim 3, the means for holding the sheets at a distance from one another comprising insulating cross members.

8. A micro-device for the filtration or the focusing of charged particles comprising a plurality of micro-devices according to claim 2, assembled in parallel, along a plurality of longitudinal axes.

9. A micro-device for the filtration or the focusing of charged particles comprising a plurality of micro-devices according to claim 1, assembled in parallel, along a plurality of longitudinal axes.

10. A micro-device according to claim 1, comprising in addition means of polarizing said conductive microelectrodes.

11. A micro-device according to claim 1, comprising, in addition, means of introducing charged particles or causing them to enter along a direction defined by said longitudinal axis, or along directions defined by the longitudinal axes.

12. A mass spectrometer comprising a micro-device according to claim 1, and means of introducing ions into the micro-device and detection means.

13. A method of producing a micro-device for generating a multi-polar transverse field or a micro-device for the filtration, or the focusing of charged particles, comprising the following steps:

etching P substrates made of insulating or semiconductor material in such a manner as to define, in each substrate one or more longitudinal microelectrodes of polygonal cross section, P being a whole number greater than or equal to 2, assembling P etched substrates in parallel with one another, in such a way that the microelectrodes are arranged around one or more longitudinal axes of propagation of the charged particles, and are adapted to generate a non-uniform electric field in a plane perpendicular to the longitudinal axis.

14. A method of producing a micro-device for generating a plurality of multi-polar transverse fields or a micro-device for the filtration or the focusing of charged particles, comprising:

the creation of individual micro-devices each permitting the generation of a multi-polar transverse field, or each permitting the carrying out of the filtration or the focusing of charged particles, and each comprising n conductive longitudinal microelectrodes of polygonal cross section, and arranged around a longitudinal axis, these microelectrodes are adapted to generate a non-uniform electric field in a plane perpendicular to the longitudinal axis, the assembly, in parallel, of the micro-devices obtained during the preceding step.

15. A mass spectrometer comprising a micro-device according to claim 7, and means of introducing ions into the micro-device and detection means.

* * * * *